(12) United States Patent
Suzuki et al.

(10) Patent No.: US 10,043,637 B2
(45) Date of Patent: Aug. 7, 2018

(54) PLASMA PROCESSING APPARATUS AND PARTICLE ADHESION PREVENTING METHOD

(71) Applicant: Tokyo Electron Limited, Tokyo (JP)

(72) Inventors: Yoshinori Suzuki, Miyagi (JP); Akitoshi Harada, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/603,648

(22) Filed: May 24, 2017

(65) Prior Publication Data

US 2017/0347442 A1   Nov. 30, 2017

(30) Foreign Application Priority Data

May 26, 2016   (JP) .................. 2016-105281

(51) Int. Cl.
*H01J 37/32* (2006.01)

(52) U.S. Cl.
CPC ...... *H01J 37/32091* (2013.01); *H01J 37/321* (2013.01); *H01J 37/3244* (2013.01); *H01J 37/32082* (2013.01); *H01J 37/32165* (2013.01); *H01J 37/32183* (2013.01); *H01J 37/32449* (2013.01); *H01J 37/32642* (2013.01); *H01J 37/32697* (2013.01); *H01J 37/32706* (2013.01); *H01J 37/32715* (2013.01)

(58) Field of Classification Search
CPC ........... H01J 37/32091; H01J 37/23082; H01J 37/32165; H01J 37/32697; H01J 37/321; H01J 37/32174; H01J 37/32183; H01J 37/3244; H01J 37/32449; H01J 37/32422; H01J 37/32834

See application file for complete search history.

(56) References Cited

U.S. PATENT DOCUMENTS 7,829,463 B2 * 11/2010 Matsumoto ....... H01J 37/32091
                                                                    118/625
8,128,831 B2 *  3/2012 Sato ..................... H01L 21/0273
                                                                    216/41

(Continued)

FOREIGN PATENT DOCUMENTS

JP         2002222795 A  *  8/2002
JP         2013-102237        5/2013

*Primary Examiner* — Vibol Tan
(74) *Attorney, Agent, or Firm* — IPUSA, PLLC (57) ABSTRACT

A plasma processing apparatus includes: a process chamber configured to accommodate a substrate such that a plasma process is performed in the process chamber; a pedestal on which the substrate is disposed; an opposite electrode opposite to the pedestal; a first radio-frequency power source configured to supply a first radio-frequency power for generating plasma on one of the pedestal and the opposite electrode; a second radio-frequency power source configured to supply a second radio-frequency power for generating a bias voltage on the pedestal, the second radio-frequency power being lower in frequency than the first radio-frequency power; a direct-current power source configured to supply a direct-current voltage to the opposite electrode; and a controller configured to control the first radio-frequency power source, the second radio-frequency power source, and the direct-current power source.

7 Claims, 8 Drawing Sheets

(56) References Cited

U.S. PATENT DOCUMENTS

| | | | | |
|---|---|---|---|---|
| 8,431,035 B2* | 4/2013 | Iwata | ................ | H01J 37/32183 |
| | | | | 118/723 E |
| 8,496,781 B2* | 7/2013 | Yokogawa | ........ | H01J 37/32174 |
| | | | | 118/723 E |
| 8,969,211 B2* | 3/2015 | Muto | .................. | H01L 21/3065 |
| | | | | 216/67 |
| 9,136,095 B2* | 9/2015 | Mori | .................. | H01J 37/32183 |
| 9,336,999 B2* | 5/2016 | Morimoto | ......... | H01J 37/32165 |
| 9,786,473 B2* | 10/2017 | Tahara | .............. | H01J 37/32449 |
| 2007/0221493 A1* | 9/2007 | Honda | ............ | H01J 37/32091 |
| | | | | 204/192.1 |
| 2012/0009356 A1* | 1/2012 | Choi | .................. | C23C 16/4404 |
| | | | | 427/579 |
| 2012/0160418 A1* | 6/2012 | Hanaoka | ........... | H01J 37/32082 |
| | | | | 156/345.38 |
| 2012/0175063 A1* | 7/2012 | Yamawaku | ........ | H01J 37/32477 |
| | | | | 156/345.46 |
| 2015/0373783 A1* | 12/2015 | Kitagawa | .................. | H05B 3/26 |
| | | | | 156/345.52 |
| 2016/0005651 A1* | 1/2016 | Watanabe | ......... | H01L 21/76897 |
| | | | | 438/702 |
| 2016/0379856 A1* | 12/2016 | Tomura | ............ | H01L 21/31116 |
| | | | | 438/711 |

* cited by examiner

| Pattern | No Delay | 1-1 | 1-1 |
|---|---|---|---|
| HF delay time | 0.0 s | 0.5 s | 1.0 s |
| LF delay time | 0.0 s | 0.5 s | 1.0 s |
| Result Particle distribution | | | |
| Particle Average | 147 | 36 | 38 |
| Particle count N=3 | 118 107 216 | 40 32 37 | 28 47 40 |

FIG. 4

| Pattern | No Delay | 1-4 | 1-4 | 1-3 | 1-3 |
|---|---|---|---|---|---|
| DC Ramp down | – | 1.0 s | 2.0 s | 1.0 s | 1.0 s |
| HF delay time | 0.0 s | 0.0 s | 0.0 s | 0.0 s | 0.5 s |
| LF delay time | 0.0 s | 0.0 s | 0.0 s | 2.0 s | 2.0 s |
| Result Particle distribution | | | | | |
| Particle Average | 147 | 8 | 6 | 5 | 6 |
| Particle count N=3 | 118 107 216 | 4 12 10 | 9 6 3 | 6 4 – | 4 9 5 |

| Pattern | No Delay | 1-2 | 1-4 | 1-3 |
|---|---|---|---|---|
| DC Ramp down | – | – | 1.0 s | 1.0 s |
| HF delay time | 0.0 s | 0.5 s | 0.0 s | 0.5 s |
| LF delay time | 0.0 s | 2.0 s | 0.0 s | 2.0 s |
| Result Particle distribution |  |  |  |  |
| Particle Average | 147 | 10 | 8 | 6 |
| Particle count N=3 | 118 / 107 / 216 | 9 / 12 / 9 | 4 / 12 / 10 | 4 / 9 / 5 |

PLASMA PROCESSING APPARATUS AND PARTICLE ADHESION PREVENTING METHOD

CROSS-REFERENCE TO RELATED APPLICATIONS

The present application claims priority under 35 U.S.C. § 119 to Japanese Patent Application No. 2016-105281 filed on May 26, 2016, the entire contents of which are incorporated herein by reference.

BACKGROUND OF THE INVENTION

1. Field of the Invention

The disclosures herein generally relate to a plasma processing apparatus and a particle adhesion preventing method.

2. Description of the Related Art

In a process chamber in which a plasma process is performed on a semiconductor wafer (hereinafter, simply referred to as a "wafer"), while the plasma process is being performed, reaction products are generated or substances constituting an inner wall of the process chamber are removed by plasma. Those products or substances formed into particles and adhering to the wafer might lead to a defect in a semiconductor device formed on the wafer, thereby reducing the yield ratio. Hence, Japanese Laid-Open Patent Application Publication No. 2013-102237 proposes a method for preventing the particles from adhering to the wafer. In Japanese Laid-Open Patent Application Publication No. 2013-102237, as soon as a dry-etching process is completed, a supply of direct-current power to an upper electrode is stopped. After a given period of time elapses, supplies of radio-frequency power for plasma generation and radio-frequency power for bias voltage generation are stopped.

According to Japanese Laid-Open Patent Application Publication No. 2013-102237, however, at the time of stopping the supply of direct-current power, sheath potential might fluctuate drastically and the particles might adhere to the wafer.

SUMMARY OF THE INVENTION

According to an embodiment of the present application, it is an object to provide a plasma processing apparatus and a particle adhesion preventing method for preventing particles from adhering to a substrate.

In order to achieve the above object, according to an embodiment of the present application, a plasma processing apparatus includes: a process chamber configured to accommodate a substrate such that a plasma process is performed in the process chamber; a pedestal on which the substrate is disposed; an opposite electrode opposite to the pedestal; a first radio-frequency power source configured to supply a first radio-frequency power for generating plasma on one of the pedestal and the opposite electrode; a second radio-frequency power source configured to supply a second radio-frequency power for generating a bias voltage on the pedestal, the second radio-frequency power being lower in frequency than the first radio-frequency power; a direct-current power source configured to supply a direct-current voltage to the opposite electrode; and a controller configured to control the first radio-frequency power source, the second radio-frequency power source, and the direct-current power source. The controller is configured to ramp down the direct-current voltage, while a plasma process is being performed or after the plasma process is completed, and before a supply of the first radio-frequency power and a supply of the second radio-frequency power are stopped. According to an embodiment of the present application, the particles are prevented from adhering to the substrate.

DESCRIPTION OF THE PREFERRED EMBODIMENTS

In the following, embodiments of the present disclosure will be described with reference to the attached drawings. Note that for the descriptions herein and each of the drawings, components that are substantially identical are referred to by the same numerals, and their repeated descriptions are omitted.

[Plasma Processing Apparatus]

Figure 1:
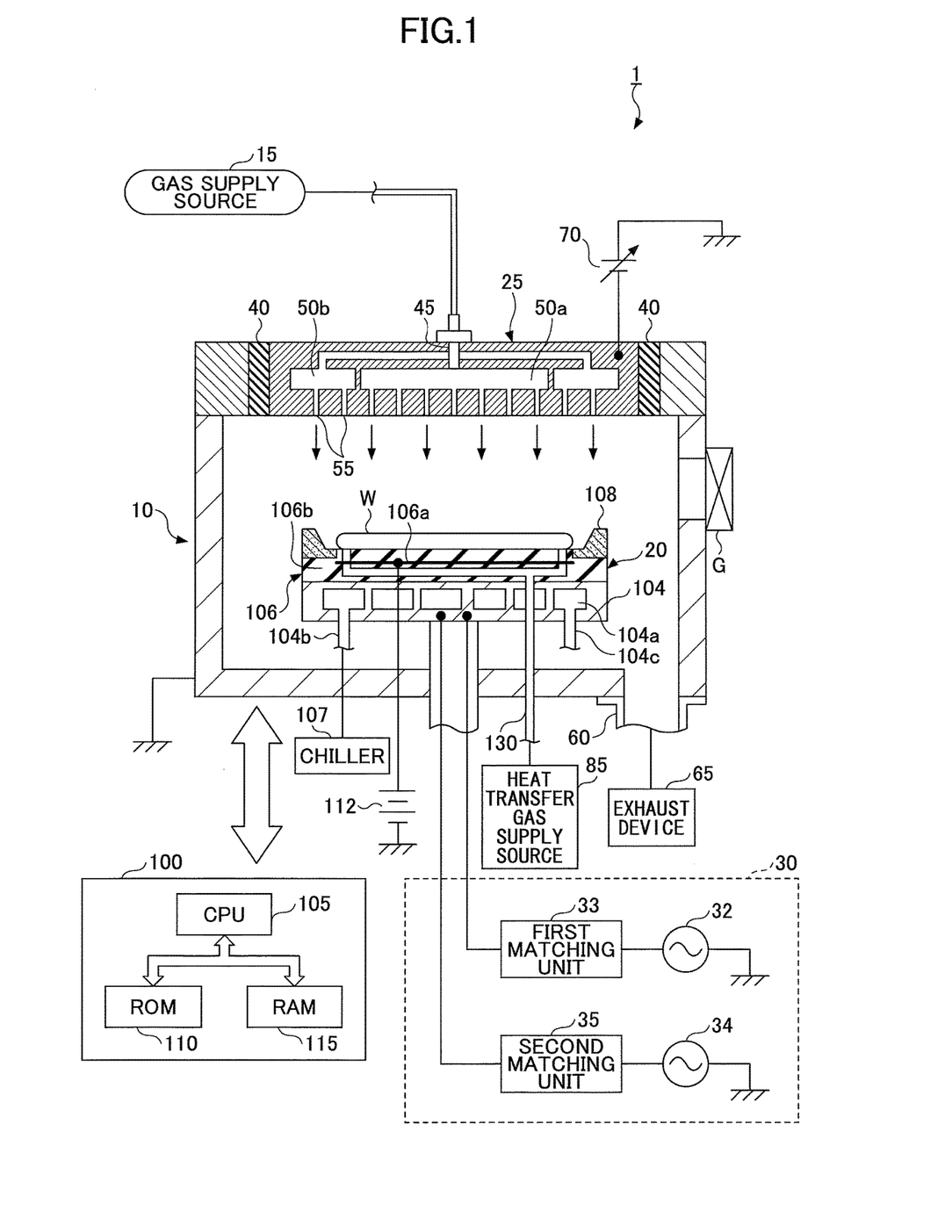
FIG. 1 illustrates one example of a cross-sectional view of a plasma processing apparatus in one embodiment.

First, one example of a plasma processing apparatus will be described with reference to FIG. 1. A plasma processing apparatus 1 in one embodiment may be a parallel-plate plasma processing apparatus of capacitive coupling type. The plasma processing apparatus 1 includes a process chamber (a chamber) 10 having a substantially cylindrical shape. An alumite treatment (an anodization treatment) is applied on an inner surface of the process chamber 10. In the process chamber (the chamber) 10, an etching process is performed by plasma or a plasma process such as a film-deposition process is performed.

On a pedestal 20, a wafer W serving as one example of a substrate is disposed. The pedestal 20 may be made of aluminium (Al), titanium (Ti), or silicon carbide (SiC), for example. The pedestal 20 may also function as a lower electrode.

On the pedestal 20, an electrostatic chuck 106 for electrostatically attracting the wafer W is arranged. The electrostatic chuck 106 has a structure in which a chuck electrode 106a is sandwiched between insulators 106b. The chuck electrode 106a is connected with a direct-current (DC) voltage source 112. When a DC voltage is supplied to the chuck electrode 106a from the DC voltage source 112, the wafer W is attracted to the electrostatic chuck 106 by Coulomb's force.

On an outer peripheral portion of the electrostatic chuck 106, a focus ring 108 having an annular shape for surrounding an outer edge portion of the wafer W is disposed. The focus ring 108 may be made of silicon, for example. In the process chamber 10, the focus ring 108 causes the plasma to converge towards a top surface of the wafer W to improve efficiency of the plasma process.

Below the pedestal 20, a support 104 is provided. This configuration allows the pedestal 20 to be supported by a bottom portion of the process chamber 10. In the support 104, a coolant passage 104a is formed. A cooling medium (hereinafter, referred to as a "coolant"), such as cooling water or brine, output from a chiller 107 is flown into a coolant inlet pipe 104b and circulated through the coolant passage 104a to a coolant outlet pipe 104c. The coolant that circulates in this way releases heat from the pedestal 20 and cools down the pedestal 20.

A heat-transfer gas supply source 85 supplies a heat-transfer gas, such as a helium gas (He) or an argon gas (Ar), through a gas supply line 130 to a bottom surface of the wafer W disposed on the electrostatic chuck 106. In such a configuration, the temperature of the electrostatic chuck 106 is controlled by the coolant circulating through the coolant passage 104a and the heat-transfer gas supplied to the bottom surface of the wafer W. Consequently, the wafer W is controlled to have a given temperature.

The pedestal 20 is connected with a power supply apparatus 30 configured to supply dual-frequency superimposed power. The power supply apparatus 30 includes a first radio-frequency power supply 32 configured to supply radio-frequency power HF (first radio-frequency power) for generating plasma of a first frequency. The power supply apparatus 30 also includes a second radio-frequency power supply 34 configured to supply radio-frequency power LF (second radio-frequency power) for generating a bias voltage of a second frequency that is lower than the first frequency. The first radio-frequency power supply 32 is electrically coupled to the pedestal 20 through a first matching device 33. The second radio-frequency power supply 34 is electrically coupled to the pedestal 20 through a second matching device 35. The first radio-frequency power supply 32 is configured to supply, for example, 60 MHz of the radio-frequency power HF to the pedestal 20. The second radio-frequency power supply 34 is configured to supply, for example, 13.56 MHz of the radio-frequency power LF to the pedestal 20. Note that in one embodiment, the first radio-frequency power is supplied to the pedestal 20, but may be supplied to a gas shower head 25.

The first matching device 33 is configured to match a load impedance with an inner (or an output) impedance of the first radio-frequency power supply 32. The second matching device 35 is configured to match a load impedance with an inner (or an output) impedance of the second radio-frequency power supply 34. The first matching device 33 functions such that the inner impedance of the first radio-frequency power supply 32 and the load impedance superficially appear to be the same as each other, while the plasma is being generated in the process chamber 10. The second matching device 35 functions such that the inner impedance of the second radio-frequency power supply 34 and the load impedance superficially appear to be the same as each other, while the plasma is being generated in the process chamber 10.

The gas shower head 25 is attached to enclose an opening of a ceiling portion of the process chamber 10 via a shield ring 40 that covers a peripheral portion of the gas shower head 25. The gas shower head 25 is connected with a variable direct-current power source 70, and the variable direct-current power source 70 outputs negative DC (direct-current voltage). The gas shower head 25 may be made of silicon, for example. The gas shower head 25 may also function as an opposite electrode (an upper electrode) opposite to the pedestal 20 (a lower electrode).

The gas shower head 25 has a gas inlet 45 for introducing gases. The inside of the gas shower head 25 includes a diffusion chamber 50a branching off from the gas inlet 45 on the center side, and a diffusion chamber 50b branching off from the gas inlet 45 on the peripheral edge side. A gas output from a gas supply source 15 is supplied through the gas inlet 45 to the diffusion chambers 50a and 50b, diffused into the diffusion chambers 50a and 50b, and introduced towards the pedestal 20 from a plurality of gas supply holes 55.

The bottom surface of the process chamber 10 has an outlet 60. An exhaust device 65 is connected with the outlet 60 and is configured to exhaust air in the process chamber 10. This configuration enables the inside of the process chamber 10 to be kept at a given vacuum degree. A gate valve G is provided on a side wall of the process chamber 10. The gate valve G is configured to open and close to carry the wafer W into the process chamber 10 or to carry the wafer W out of the process chamber 10.

The plasma processing apparatus 1 includes a controller 100 configured to control operations of the entire plasma processing apparatus 1. The controller 100 includes a Central Processing Unit (CPU) 105, a Read Only Memory (ROM) 110, and a Random Access Memory (RAM) 115. The CPU 105 performs a desired process, such as an etching process, in accordance with a recipe stored in a memory area of the RAM 115, for example. The recipe includes control information for controlling the plasma processing apparatus 1 for meeting process conditions. Such control information may include a process time, a pressure (exhaust of gas), radio-frequency power and voltage, flow rates of various gases, temperatures in the process chamber (such as an upper electrode temperature, a side wall temperature of the process chamber, a wafer W temperature, and an electrostatic chuck temperature), and a temperature of the coolant output from the chiller 107. Note that programs or recipes indicating these process conditions may be stored in a hard disk or in a semiconductor memory. Additionally, the recipes may be recorded in a computer-readable recording medium that is portable, such as a CD-ROM or a DVD, and such a computer-readable recording medium may be set at a given position to read out the recipe.

In performing the plasma process, opening and closing of the gate valve G are controlled. The wafer W is carried into the process chamber 10 and is placed on the pedestal 20. When the DC voltage is supplied to the chuck electrode 106a from the DC voltage source 112, the wafer W is attracted to the electrostatic chuck 106 and is held on the electrostatic chuck 106.

A process gas is supplied into the process chamber 10 from the gas supply source 15. The first radio-frequency power supply 32 and the second radio-frequency power supply 34 respectively supply the pedestal 20 with the first radio-frequency power and the second radio-frequency power. The variable direct-current power source 70 supplies the gas shower head 25 with the negative DC (the DC voltage). In this process, the plasma is generated above the wafer W, and the plasma process is performed for the wafer W. After the plasma process, the DC voltage source 112 supplies the chuck electrode 106a with a DC voltage that is inverted in polarity from the DC voltage supplied for attracting the wafer W, so as to eliminate electric charge of the wafer W and to remove the wafer W from the electrostatic chuck 106. The opening and closing of the gate valve G are controlled and the wafer W is carried out of the process chamber 10.

[Particle Adhesion Preventing Method 1 (Pattern 1-1)]

Next, a particle adhesion preventing method 1 in one embodiment will be described with reference to FIG. 2. Referring to a time chart of Pattern 1-1 illustrated in an upper part of FIG. 2, in the particle adhesion preventing method 1 in one embodiment, after the plasma process for the wafer W is completed, a supply of the DC (hereinafter, referred to as "Top DC") output from the variable direct-current power source 70 is stopped at a time t1. Subsequently, supplies of the first radio-frequency power HF (hereinafter, referred to as "HF RF") output from the first radio-frequency power supply 32 and the second radio-frequency power HF (hereinafter, referred to as "LF RF") output from the second radio-frequency power supply 34 are stopped at the same time at a time t2.

Figure 2:
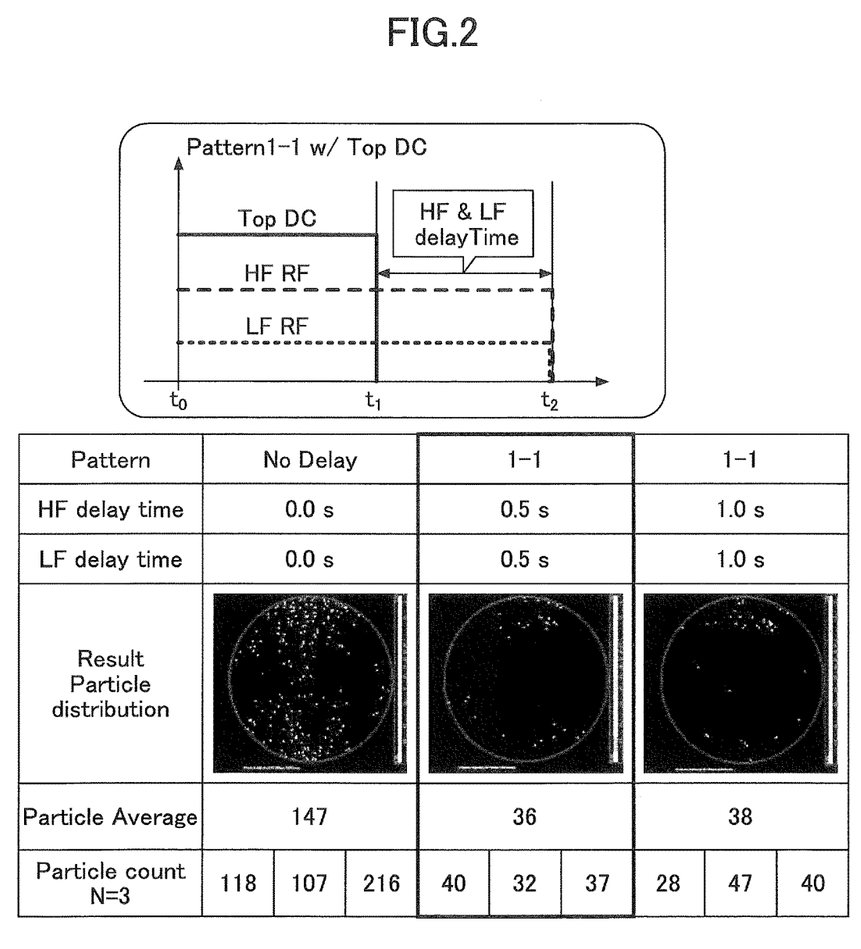
FIG. 2 illustrates one example of a particle adhesion preventing method and results in one embodiment.

In pattern 1-1, results obtained when the supplies of the power were sequentially stopped such that "Top DC" was stopped first, and then "HF RF" and "LF RF" were stopped at the same time, are illustrated as particle results of Pattern 1-1 in a lower part of FIG. 2. Pattern 1-1 in the middle of a table in the lower part of FIG. 2 indicates that delay times of HF and LF (=t2−t1) were both 0.5 seconds. In other words, the supplies of "HF RF" and "LF RF" were stopped at the same time, which was 0.5 seconds after the supply of "Top DC" had been stopped.

Pattern 1-1 on the right side in the table indicates a case where the delay times of HF and LF (=t2−t1) were both 1.0 second. In other words, the supplies of "HF RF" and "LF RF" were stopped at the same time, which was 1.0 second after the supply of "Top DC" had been stopped.

No Delay on the left side in the table indicates a case where the delay times of HF and LF (=t2−t1) were both 0.0 seconds. In other words, all of the supplies of "Top DC", "HF RF", and "LF RF" were stopped at the same time.

Experimental results in both cases of Pattern 1-1 in the middle and Pattern 1-1 on the right side indicated that the number of particles on the wafer W was reduced to approximately one-fourths the number of particles in the case of Pattern No Delay. Note that in experiments in the particle adhesion preventing method 1 and in the respective experiments in particle adhesion preventing methods 2 and 3 to be described later, sequences for Pattern 1-1 and Pattern No Delay were performed three times respectively, and average values of the number of particles were compared with each other. Additionally, the experimental results in both cases of Pattern 1-1 indicated that almost the same numbers of particles on the wafer W were reduced. Therefore, the experimental results indicated that effectiveness of reducing the particle adhesion to the wafer W was achieved by the sequence in the particle adhesion preventing method 1 in which the supplies of the power were sequentially stopped such that the supply of "Top DC" was stopped first, and then the supplies of "HF RF" and "LF RF" were stopped at the same time. Further, the experimental results indicated that the effectiveness of reducing the particles were not very different between the cases where the delay times of "HF RF" and "LF RF" were 0.5 seconds and 1 second.

[Particle Adhesion Preventing Method 2 (Pattern 1-2, Pattern 2)]

Next, a particle adhesion preventing method 2 in one embodiment will be described with reference to FIG. 3. Time charts of Pattern 1-2 and Pattern 2 are illustrated in an upper part of FIG. 3.

In Pattern 1-2 in the particle adhesion preventing method 2 in one embodiment, after the plasma process for the wafer W is completed, the supply of "Top DC" output from the variable direct-current power source 70 is stopped. Next, the supply of "HF RF" output from the first radio-frequency power supply 32 is stopped. Then, the supply of "LF RF" output from the second radio-frequency power supply 34 is stopped. In other words, in Pattern 1-2, the supplies of the power are sequentially stopped in an order of "Top DC", "HF RF", and "LF RF".

In Pattern 2 in the particle adhesion preventing method 2 in one embodiment, "Top DC" is not supplied on the wafer W during the plasma process. Hence, in Pattern 2, after the plasma process for the wafer W is completed, the supplies of the power are sequentially stopped in an order of "HF RF" and "LF RF" or in an order of "LF RF" and "HF RF".

Figure 3:
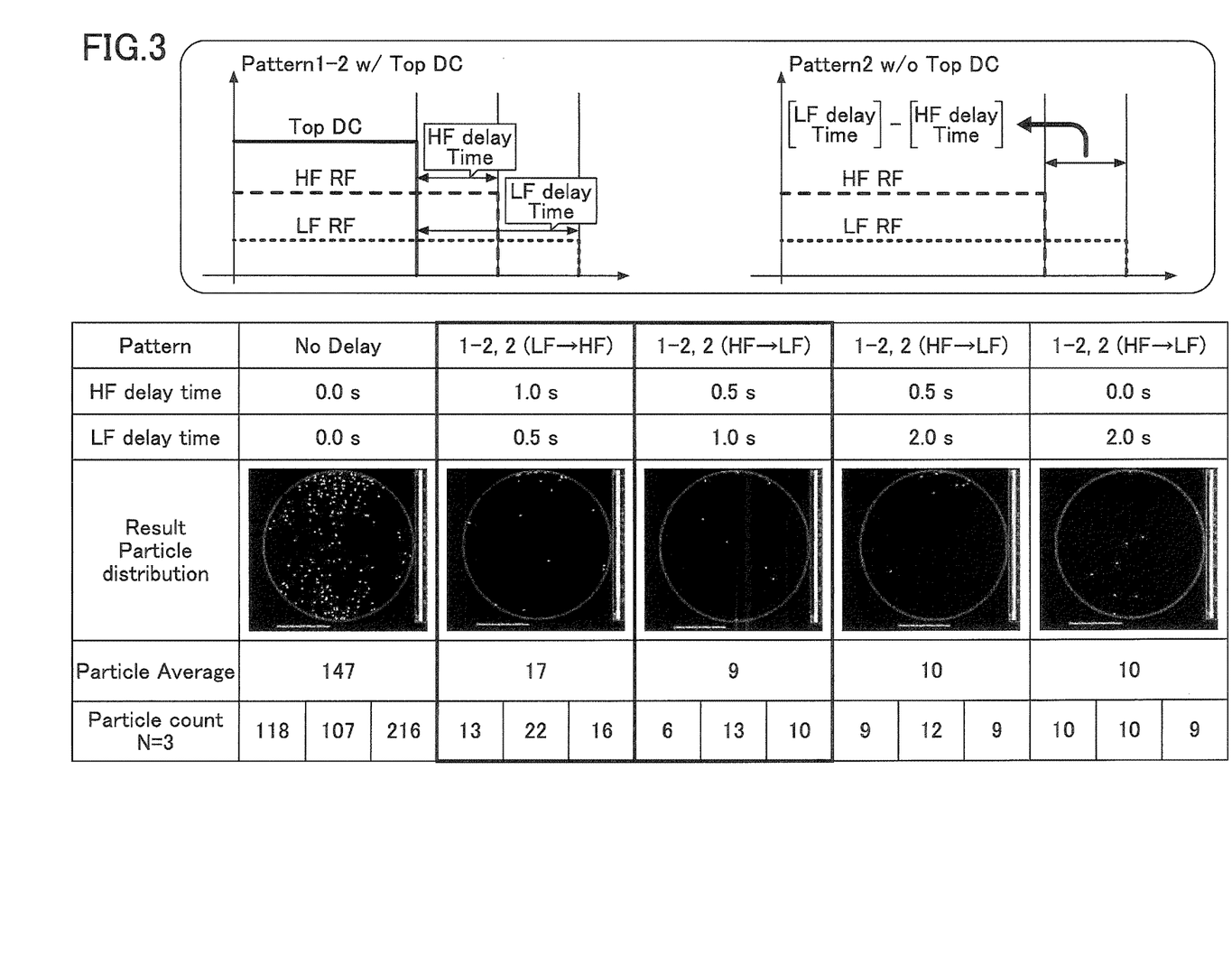
FIG. 3 illustrates one example of a particle adhesion preventing method and results in one embodiment.

A table in a lower part of FIG. 3 illustrates experimental results obtained when the supplies of the power were stopped in the methods of Pattern 1-2 and Pattern 2, after the plasma process was completed. Pattern No Delay in the leftmost column in the table indicates a case where the delay time of HF and LF are both 0.0 seconds. In other words, all the supplies of "Top DC", "HF RF", and "LF RF" were stopped at the same time. Pattern No Delay in the leftmost column in FIG. 3 had the same results as Pattern No Delay in the table in the lower part of FIG. 2.

In Pattern 1-2 and Pattern 2 on the right side of Pattern No Delay, as indicated in parentheses in each Pattern column, there was a delay between a stop timing when the supply of "HF RF" was stopped and a stop timing when the supply of "LF RF" was stopped. In Pattern 1-2, 2 (LF→HF) in a thick frame on the left side, the supply of "HF LF" was stopped when 0.5 seconds elapsed after the supply of "Top DC" had been stopped, and the supply of "HF RF" was stopped when 1.0 second elapsed after the supply of "Top DC" had been stopped. In Pattern 1-2, 2 (HF→LF) in a thick frame on the right side, the supply of "HF RF" was stopped when 0.5 seconds elapsed after the supply of "Top DC" had been stopped, and the supply of "LF RF" was stopped when 1.0 second elapsed after the supply of "Top DC" had stopped.

According to both Pattern 1-2, 2 (LF→HF) and Pattern 1-2, 2 (HF→LF) indicated in the thick frames, the experimental results indicated that the number of particles on the wafer W was reduced to approximately one-tenths the number of particles in Pattern No Delay.

In addition, the experimental results indicated that the number of particles on the wafer W in Pattern 1-2, 2 (HF→LF) was reduced to be fewer than the number of particles on the wafer W in Pattern 1-2, 2 (LF→HF). Therefore, the experimental results indicated that in the sequence in which the supplies of power were stopped in the order of "Top DC", "HF RF", and "LF RF", the particles adhering to the wafer W was effectively reduced to be fewer than the particles in the sequence in which the supplies of power were stopped in the order of "Top DC", "LF RF", and "HF RF".

Pattern 1-2, 2 (HF→LF), which are two patterns on the right side of the thick frames in the table in the lower part of FIG. 3, illustrate experimental results of cases where the delay time of "HF RF" and the delay time of "LF RF" were changed. The experimental results indicated that the number of particles was effectively reduced in the sequence in which after the supply of the "Top DC" was stopped, the supply of "HF RF" was stopped, and then the supply of "LF RF" was stopped in this order. The experimental results indicated that even in a case where either a stop timing of stopping the supply of "HF RF" or a stop timing of stopping the supply of "HF LF" was changed by approximately one second, a very high level of the effectiveness in reducing the number of particles was achieved.

[Particle Adhesion Preventing Method 3 (Pattern 1-3, Pattern 1-4)]

Next, a particle adhesion preventing method 3 in one embodiment will be described with reference to FIG. 4. Time charts of Pattern 1-3 and Pattern 1-4 are illustrated in an upper part of FIG. 4.

In Pattern 1-3 in the particle adhesion preventing Method 3 in one embodiment, after the plasma process for the wafer W is completed, "Top DC" output from the variable direct-current power source 70 is ramped down. After the supply of "Top DC" is stopped, the supply of "HF RF" output from the first radio-frequency power supply 32 is stopped, and then the supply of LF RF" output from the second radio-frequency power supply 34 is stopped. In other words, in Pattern 1-3, the supplies of power are stopped sequentially such that after "Top DC" is ramped down and stopped, the supply of "HF RF" is stopped and then the supply of "LF RF" is stopped.

A method for controlling ramping down of "Top DC" may include not only the method for reducing the supplied direct-current voltage in a stepwise manner as indicated in Pattern 1-3 but also a method for reducing the supplied direct-current voltage continuously as indicated in Pattern 1-4.

As illustrated Pattern 1-4, when the supply of "Top DC" is stopped after the supply of "Top DC" has been ramped down, the supplies of "HF RF" and "LF RF" may be controlled and stopped. Alternatively, before the supply of "Top DC" is stopped after the supply of "Top DC" has been ramped down, the supplies of "HF RF" and "LF RF" may be controlled and stopped. When or before the supply of "Top DC" is stopped after the supply of "Top DC" has been ramped down, the supplies of "HF RF" and "LF RF" may be controlled and stopped sequentially in the order of "HF RF" and "LF RF".

Figure 4:
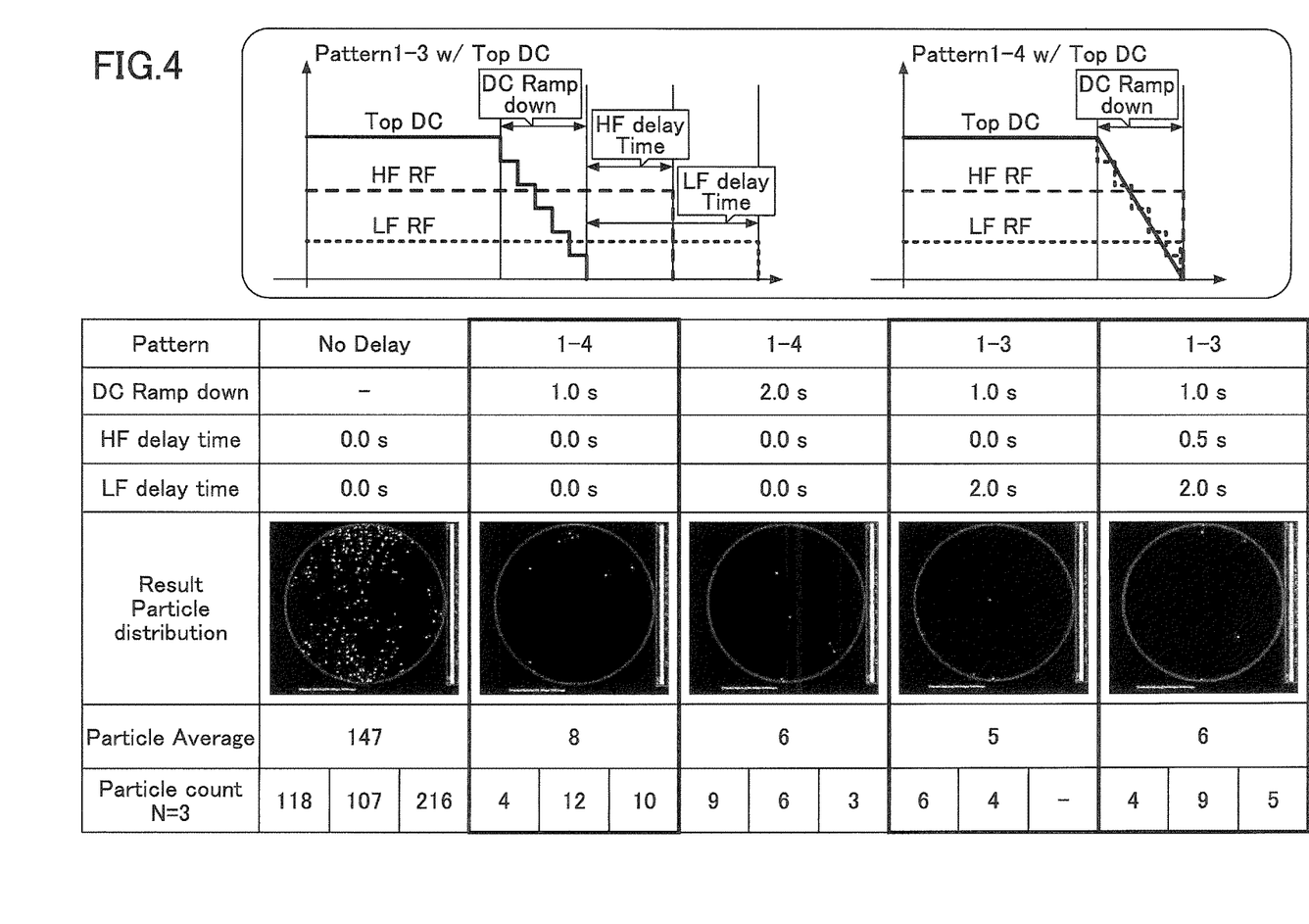
FIG. 4 illustrates one example of a particle adhesion preventing method and results in one embodiment.

A table in a lower part of FIG. 4 illustrates experimental results obtained when the supplies of power were stopped in the methods of Pattern 1-3 and Pattern 1-4, after the plasma process was completed. Pattern No Delay in the leftmost column in a table in a lower part of FIG. 4 indicates a case where the delay time of HF and LF were both 0.0 seconds. In other words, all of the supplies of "Top DC", "HF RF", and "LF RF" were stopped at the same time. Pattern No Delay in the leftmost column in FIG. 4 had the same results as Pattern No Delay in the tables in the lower parts of FIG. 2 and FIG. 3.

In Pattern 1-4 and Pattern 1-3 indicated on the right side of Pattern No Delay, the experimental results indicated that the number of particles on the wafer W was reduced to approximately one-twentieths the number of particles in Pattern No Delay. In other words, the experimental results indicated that in the method for stopping the supplies of power "HF RF" and "LF RF" after ramping down "Top DC", a very high level of the effectiveness in reducing the particles adhering to the wafer W was achieved.

In addition, the experimental results indicated that the number of particles adhering to the wafer W in Pattern 1-3 was reduced to be fewer than the number of particles in Pattern 1-4. That is to say, the experimental results indicated that in the method for ramping down "Top DC", stopping the supply of "Top DC", stopping the supply of "HF RF", and stopping the supply of "LF RF" sequentially in this order, the highest level of the effectiveness in reducing the particles adhering to the wafer W was achieved.

[Reasons for Preventing Particle Adhesion]

Figure 5A:
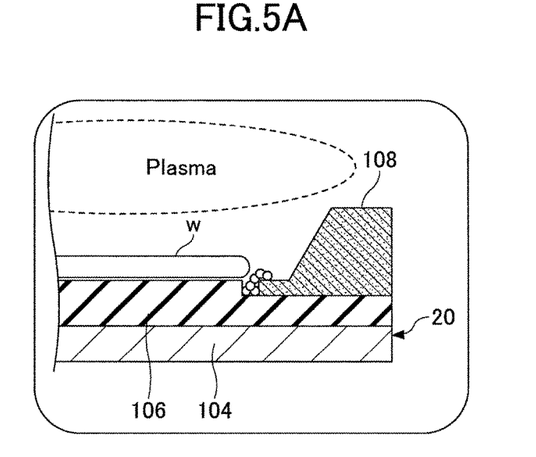
FIG. 5A to FIG. 5C illustrate reasons for a particle adhesion preventing method in one embodiment.
Figure 5B:
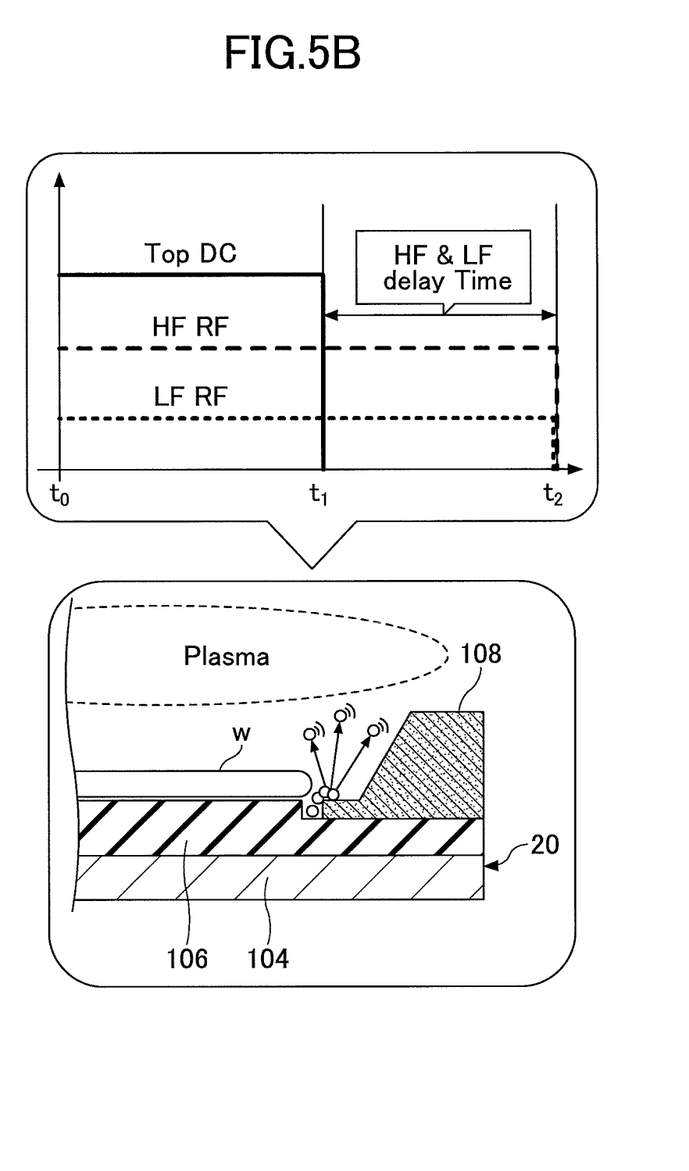
Figure 5C:
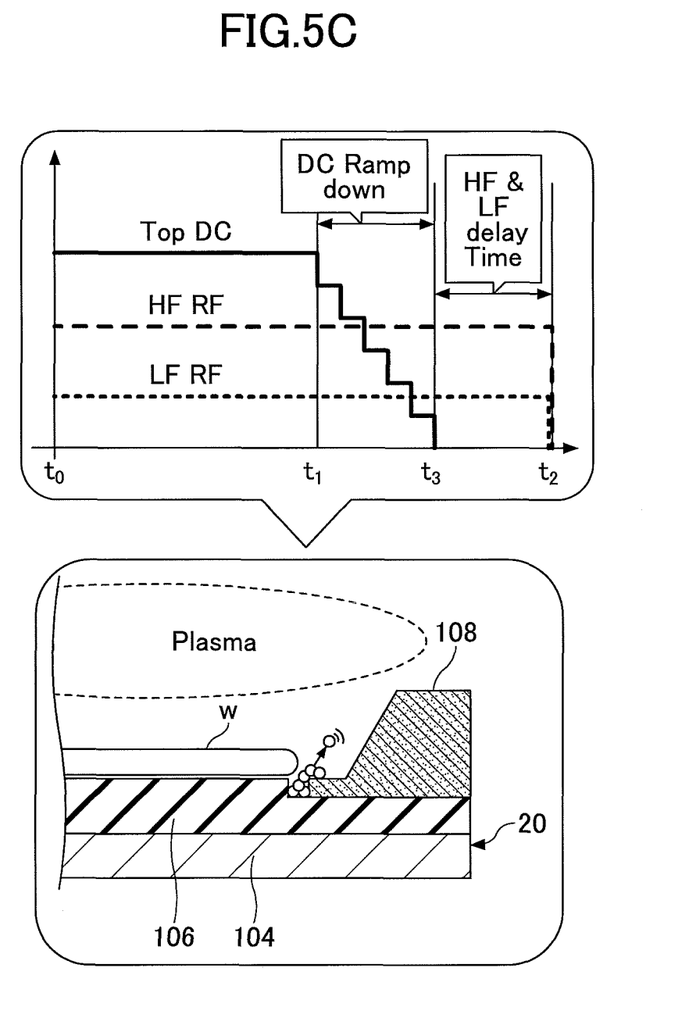

In the following, reasons for the above-described methods for preventing the particle adhesion will be described with reference to FIG. 5A to FIG. 5C. FIG. 5A to FIG. 5C illustrate examples of cross-sectional views of a boundary between the electrostatic chuck 106 and the focus ring 108. FIG. 5A illustrates a state in the outer edge portion of the wafer W that is modeled when the plasma process for the wafer W is completed. Between the electrostatic chuck 106 and the focus ring 108, reaction products that have been generated during the plasma process and substances constituting the inner wall of the process chamber 10 that have been removed by plasma are adhered.

The focus ring 108 serves as an annular member arranged at the outer edge portion of the wafer W. Because the uppermost height of the focus ring 108 is higher than the top surface of the wafer W, the substances that become sources of the particles, such as the reaction products, are readily piled up between the electrostatic chuck 106 and the focus ring 108 at the outer edge portion of the wafer W.

In this state, when "Top DC" (the direct-current voltage) is stopped drastically from ON to OFF (On to OFF control at the time t1 in a time chart in an upper part of FIG. 5B), the sheath potential fluctuates drastically.

To be specific, during the plasma process, in a state where "Top DC" is supplied to the gas shower head 25 functioning as the upper electrode, sheath phenomenon that is produced at the upper electrode causes a surface of the upper electrode to have the negative potential.

In this state, when the supply of "Top DC" is stopped, the surface of the upper electrode is drastically changed from the negative potential to a positive potential. Consequently, as illustrated in FIG. 5B, negatively-charged particles are instantaneously attracted towards the upper electrode, resulting in the particles readily adhering to a surface of the outer edge portion of the wafer W. This brings a situation where the particles adhering to the wafer W are increased.

In contrast, in the particle adhesion preventing method 3, the supply of "Top DC" is controlled to be ramped down and then stopped. In such a controlling manner, the supply of "Top DC" is gradually stopped, so that the surface of the wafer W is prevented from drastically changing from the negative potential to the positive potential. Thus, as illustrated in FIG. 5C, the negatively-charged particles become less likely to be attracted towards the outer edge portion of the wafer W. Therefore, at the time when the supply of "Top DC" is stopped (after ramping-down control from a time t1 to a time t3 in a time chart of an upper part in FIG. 5C), the particles adhering to the wafer W are reduced.

CONCLUSION

Figure 6:
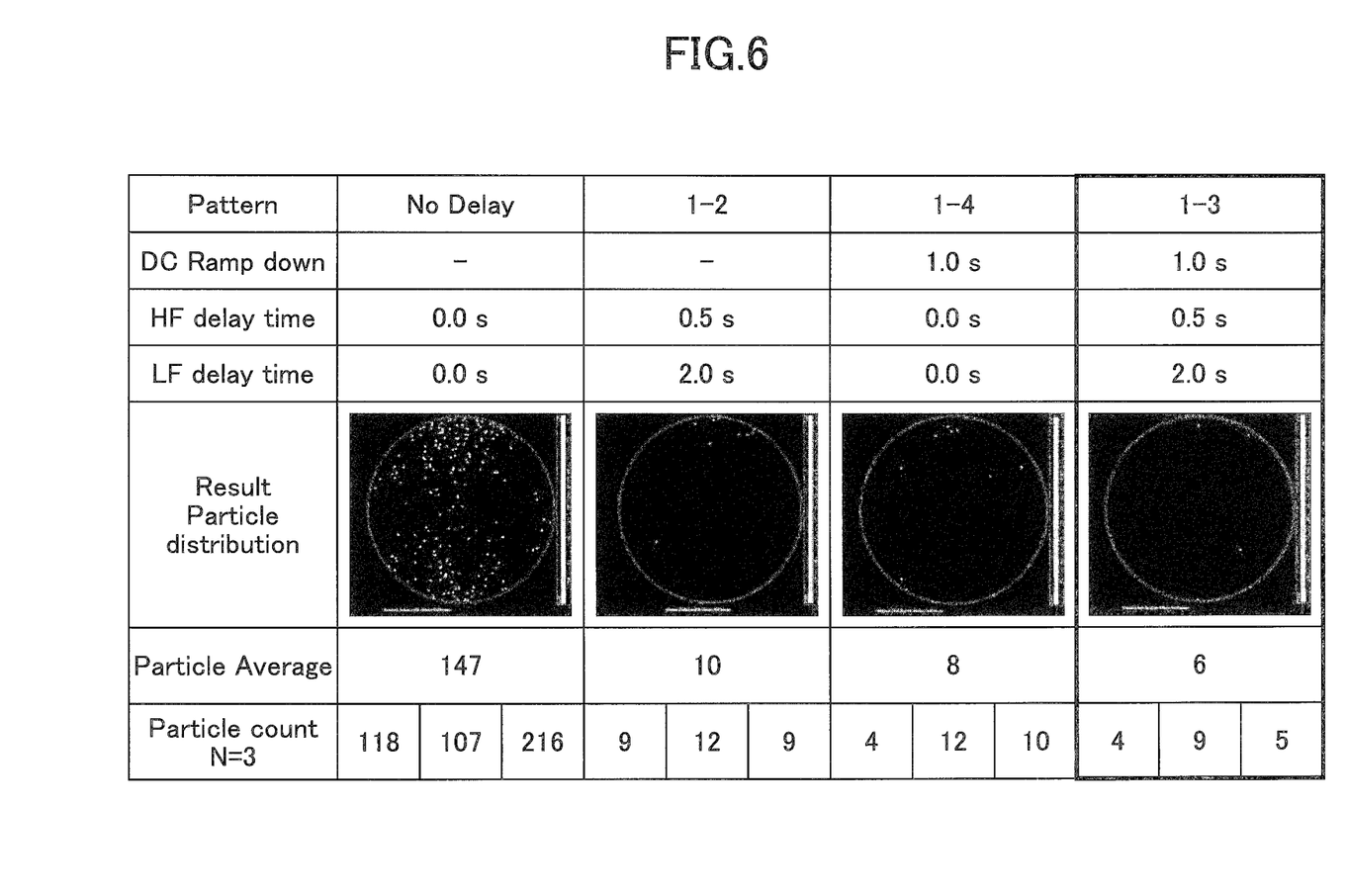
FIG. 6 illustrates a list of the particle adhesion preventing methods in some embodiments and comparison results.

In the above description, the particle adhesion preventing methods 1 to 3 in some embodiments of the present application will be summarized with reference to FIG. 6. As illustrated in Pattern 1-3 and Pattern 1-4 of FIG. 6 (see the sequences of Pattern 1-3 and Pattern 1-4 in FIG. 4), in the case where the supply of "Top DC" is ramped down and is then stopped, the particles adhering to the wafer W are reduced.

In addition, as illustrated in Pattern 1-2 in FIG. 6 (see the sequence of Pattern 1-2 in FIG. 3), by stopping the supplies of "HF RF" and "LF RF" sequentially in the order of "HF RF" and "LF RF", without ramping down the supply of "Top DC", the particles adhering to the wafer W are reduced.

In the case of Pattern 1-2, the reason the particles adhering to the wafer W are reduced will be described. In both cases where "HF RF" is supplied and where "LF RF" is supplied, the sheath phenomena are respectively produced at the upper electrode, the wafer W, and the focus ring 108 while either "HF RF" or the "LF RF" is being supplied. Negatively-charged sheaths cause the wafer W and the focus ring 108 to be negatively charged.

By continuously supplying "LF RF" when the supply of "HF RF" is stopped, all of the sheath phenomena that have been produced can be avoided from disappearing. This causes the surface of the wafer W to be negatively charged, and prevents the negatively-charged particles from adhering to the wafer W. Further, by stopping the supplies of power sequentially in the order of "HF RF" and "LF RF", the sheath potential that drastically fluctuates is avoided. Thus, the particles are prevented from adhering to the wafer W.

In comparing "HF RF" with "LF RF", because plasma generated when "HF RF" is supplied has a higher frequency than the frequency of plasma generated when "LF RF" is supplied, the plasma generated when "HF RF" is supplied is unstable. As long as the plasma is unstable, the sheath phenomena that are produced are also unstable. Hence, in the sequence where the supply of "LF RF" that produces more stable plasma is stopped after the supply of "HF RF" is stopped, the surface of the wafer W is negatively charged in a more stable manner. Therefore, the particles are prevented from adhering to the wafer W by stopping the supplies sequentially in the order of "HF RF" and "LF RF" in a more effective manner than by stopping the supplies sequentially in the order of "LF RF" and "HF RF".

By combining "ramping down of "Top DC"" with "stopping of the supplies sequentially in the order of "HF RF" and "LF RF"", the particles are prevented from adhering to the wafer W in a most effective manner. That is to say, in the sequence of Pattern 1-3 in which the supplies of power are stopped sequentially such that "Top DC" is ramped down, the supply of "HF RF" is stopped, and then the supply of "LF RF" is stopped, the particles are prevented from adhering to the wafer W in a most effective manner, as illustrated in FIG. 6.

To be specific, in the sequence in Pattern 1-3, the number of particles adhering to the wafer W was reduced to approximately one-twenty-fifths the number of particles in Pattern No Delay where all of the supplies of "Top DC", "HF RF", and "LF RF" were stopped at the same time.

As described heretofore, the experimental results in the particle adhesion preventing methods 1 to 3 in some embodiments indicated that in the sequence where the supplies of power were stopped sequentially such that "Top DC" was ramped down, the supply of "HF RF" was stopped, and then the supply of "LF RF" was stopped in this order, the particles adhering to the wafer W were reduced in the most effective manner.

In addition to Pattern 1-3, the experimental results indicated that in the sequence of Pattern 1-4 where the supplies of power were stopped sequentially such that "Top DC" was ramped down, and then the supplies of "HF RE" and "LF RF" were stopped at the same time, the particles adhering to the wafer W were reduced.

Further, the experimental results indicated that as in Pattern 1-2 and Pattern 2, also in the sequence that did not ramp down "Top DC", but the supplies of power were sequentially stopped in the order of "HF RF" and "LF RF", the particles adhering to the wafer W were reduced.

Heretofore, the plasma processing apparatus and the particle adhesion preventing methods in some embodiments have been described. However, the plasma processing apparatus and the particle adhesion preventing methods are not limited to the above-described embodiments. Various variations and modifications may be made without departing from the scope of the present disclosure. Examples and matters that have been described in the above embodiments can be combined together as long as they are consistent.

For example, the particle adhesion preventing methods for preventing the particles from adhering to the substrate are applicable to not only Capacitively Coupled Plasma (CCP) apparatuses but also other plasma processing apparatuses. Examples of the other plasma processing apparatuses may include an Inductively Coupled Plasma (ICP) processing apparatus, a plasma processing apparatus utilizing a radial line slot antenna, a Helicon Wave Plasma (HWP) processing apparatus, and an Electron Cyclotron Resonance (ECR) plasma processing apparatus.

Herein, the semiconductor wafer W has been described as one example of the substrate. However, the substrate is not limited to the semiconductor wafer W. Examples of the substrate may include various types of substrates that can be used in a Liquid Crystal Display (LCD) or a Flat Panel Display (FPD), photomasks, CD substrates, and printed substrates.

What is claimed is:

1. A plasma processing apparatus comprising:
    a process chamber configured to accommodate a substrate such that a plasma process is performed in the process chamber;
    a pedestal on which the substrate is disposed;
    an opposite electrode opposite to the pedestal;
    a first radio-frequency power source configured to supply a first radio-frequency power for generating plasma on one of the pedestal and the opposite electrode;
    a second radio-frequency power source configured to supply a second radio-frequency power for generating a bias voltage on the pedestal, the second radio-frequency power being lower in frequency than the first radio-frequency power;
    a direct-current power source configured to supply a direct-current voltage to the opposite electrode; and
    a controller configured to control the first radio-frequency power source, the second radio-frequency power source, and the direct-current power source,
    wherein the controller is configured to ramp down the direct-current voltage, while a plasma process is being performed or after the plasma process is completed, and before a supply of the first radio-frequency power and a supply of the second radio-frequency power are stopped.

2. The plasma processing apparatus according to claim 1, wherein the controller is configured to stop the direct-current voltage that has been ramped down, while the plasma process is being performed or after the plasma process is completed, and before or when the supply of the first radio-frequency power and the supply of the second radio-frequency power are stopped.

3. The plasma processing apparatus according to claim 1, wherein the controller is configured to stop a supply of the first radio-frequency power, and then the controller is configured to stop a supply of the second radio-frequency power.

4. The plasma processing apparatus according to claim 1, further comprising an annular member arranged at an outer edge portion of the pedestal, an uppermost height of the annular member being higher than the substrate.

5. A plasma processing apparatus comprising:
    a process chamber configured to accommodate a substrate such that a plasma process is performed in the process chamber;
    a pedestal on which the substrate is disposed;
    an opposite electrode opposite to the pedestal;

a first radio-frequency power source configured to supply a first radio-frequency power for generating plasma on one of the pedestal and the opposite electrode;

a second radio-frequency power source configured to supply a second radio-frequency power for generating a bias voltage on the pedestal, the second radio-frequency power being lower in frequency than the first radio-frequency power; and a controller configured to control the first radio-frequency power source and the second radio-frequency power source, wherein while a plasma process is being performed or after the plasma process is completed, the controller is configured to stop a supply of the first radio-frequency power, and then the controller is configured to stop a supply of the second radio-frequency power after the supply of the first radio-frequency power is stopped.

6. A particle adhesion preventing method for preventing a particle from adhering to a substrate for which a plasma process in performed by a plasma processing apparatus including a process chamber configured to accommodate the substrate such that the plasma process is performed in the process chamber a pedestal on which the substrate is disposed an opposite electrode opposite to the pedestal a first radio-frequency power source configured to supply a first radio-frequency power for generating plasma on one of the pedestal and the opposite electrode a second radio-frequency power source configured to supply a second radio-frequency power for generating a bias voltage on the pedestal, the second radio-frequency power being lower in frequency than the first radio-frequency power a direct-current power source configured to supply a direct-current voltage to the opposite electrode, and a controller configured to control the first radio-frequency power source, the second radio-frequency power source, and the direct-current power source, the particle adhesion preventing method comprising:

ramping down the direct-current voltage, while a plasma process is being performed or after the plasma process is completed; and stopping a supply of the first radio-frequency power and a supply of the second radio-frequency power.

7. The plasma processing apparatus according to claim 1, wherein the controller is configured to stop the supply of the first radio-frequency power and the supply of the second radio-frequency power at the same time.

* * * * *